United States Patent
Zimmerhackl et al.

(10) Patent No.: US 9,218,994 B2
(45) Date of Patent: Dec. 22, 2015

(54) TWO-DIMENSIONAL TRANSFER STATION USED AS INTERFACE BETWEEN A PROCESS TOOL AND A TRANSPORT SYSTEM AND A METHOD OF OPERATING THE SAME

(75) Inventors: Olaf Zimmerhackl, Lohmen (DE); Alfred Honold, Bad Abbach (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1680 days.

(21) Appl. No.: 12/039,980

(22) Filed: Feb. 29, 2008

(65) Prior Publication Data

US 2009/0035101 A1 Feb. 5, 2009

(30) Foreign Application Priority Data

Jul. 31, 2007 (DE) .......................... 10 2007 035 836

(51) Int. Cl.
*B65H 1/00* (2006.01)
*H01L 21/67* (2006.01)
*H01L 21/677* (2006.01)

(52) U.S. Cl.
CPC ...... *H01L 21/67276* (2013.01); *H01L 21/6773* (2013.01); *H01L 21/67715* (2013.01); *H01L 21/67769* (2013.01); *H01L 21/67775* (2013.01)

(58) Field of Classification Search
None
See application file for complete search history.

(56) References Cited

U.S. PATENT DOCUMENTS

| | | | | |
|---|---|---|---|---|
| 6,663,340 | B1 | 12/2003 | Zeakes et al. | 414/940 |
| 6,715,978 | B2 | 4/2004 | Lin et al. | 414/416.05 |
| 2003/0082032 | A1 | 5/2003 | McGowan | 414/273 |
| 2004/0265107 | A1 | 12/2004 | Kim et al. | 414/626 |
| 2008/0240892 | A1* | 10/2008 | Courtois et al. | 414/225.01 |

FOREIGN PATENT DOCUMENTS

| | | | | |
|---|---|---|---|---|
| DE | 198 16 127 A1 | 2/1999 | | B65G 47/50 |
| DE | 199 52 195 A1 | 5/2001 | | H01L 21/18 |

OTHER PUBLICATIONS

Jun. 26, 2008 letter from foreign associate forwarding Official Communication.
Translation of Official Communication issued May 27, 2008.

* cited by examiner

*Primary Examiner* — Saul Rodriguez
*Assistant Examiner* — Willie Berry, Jr.
(74) *Attorney, Agent, or Firm* — Amerson Law Firm, PLLC

(57) ABSTRACT

By providing a space-efficient transfer buffer system in a manufacturing environment, which may act as a local interface between an automated transport system and the load port assembly of a process tool under consideration, the I/O capability of the process tool may be significantly enhanced, while not unduly contributing to the overall width of the process tools. In particular embodiments, an array-like arrangement of respective buffer places is used, wherein each buffer place is accessible by the transport system and may also interact with each of the load ports of the process tool.

28 Claims, 6 Drawing Sheets

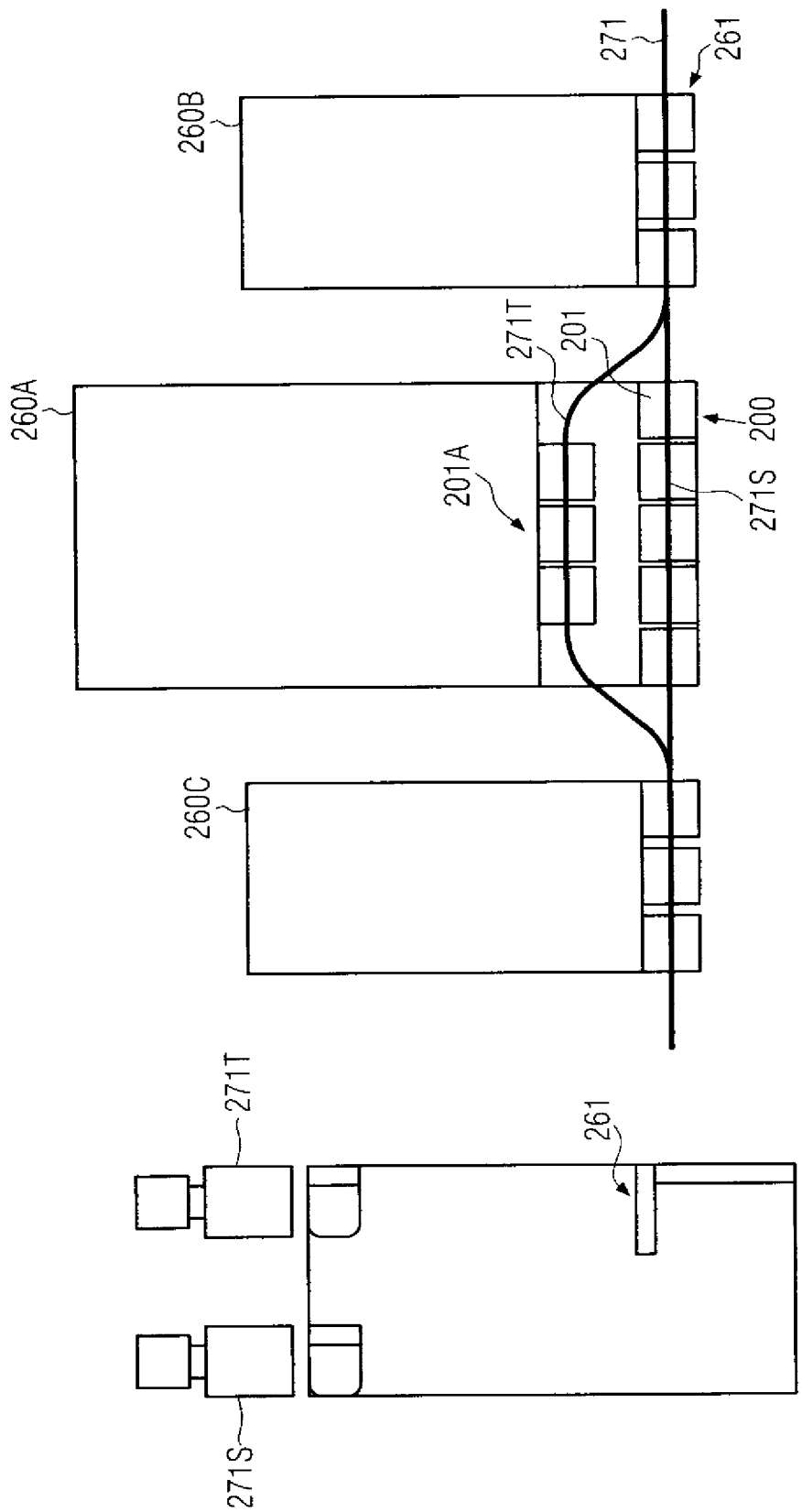

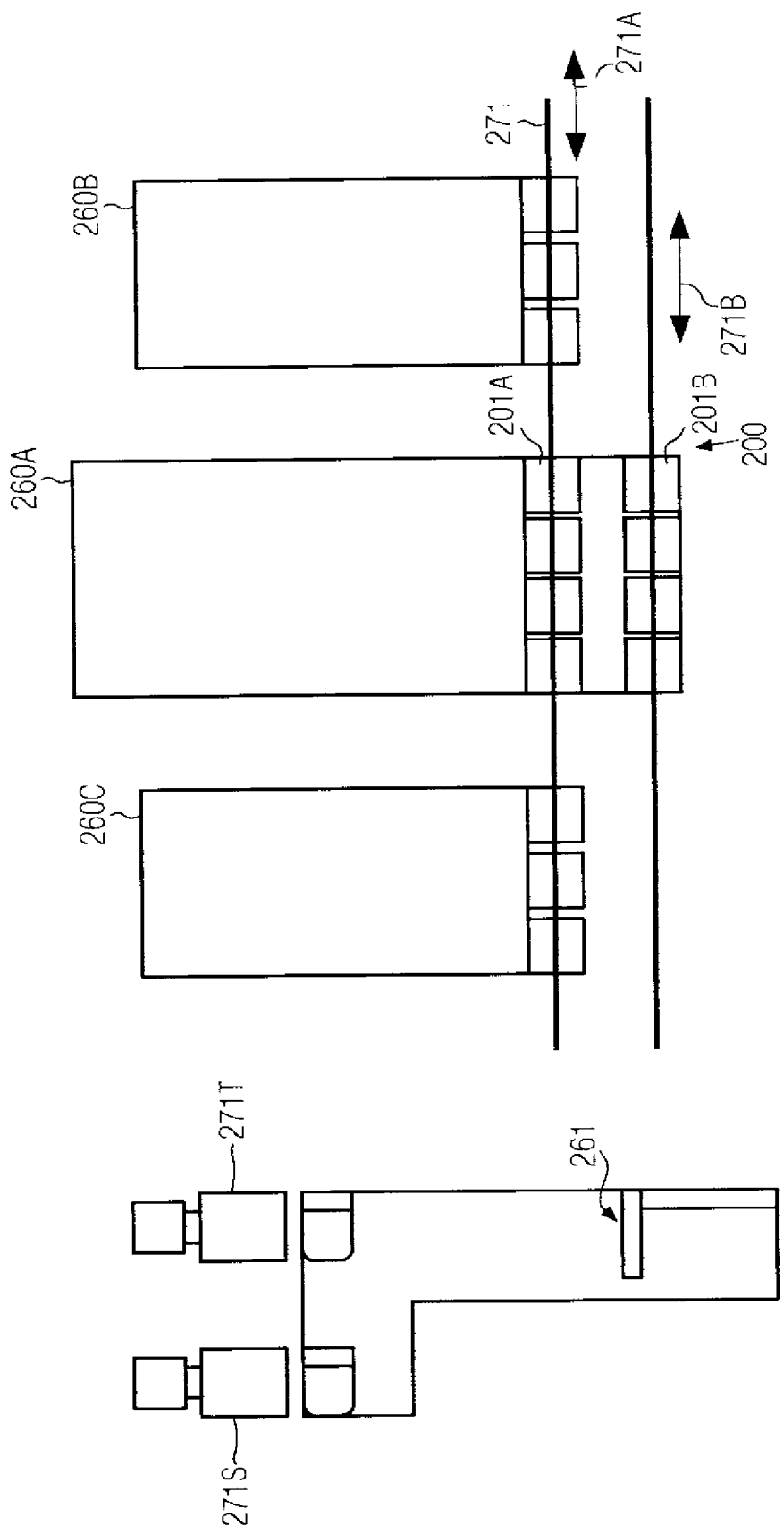

TWO-DIMENSIONAL TRANSFER STATION USED AS INTERFACE BETWEEN A PROCESS TOOL AND A TRANSPORT SYSTEM AND A METHOD OF OPERATING THE SAME

BACKGROUND OF THE INVENTION

1. Field of the Invention

Generally, the present disclosure relates to the field of fabricating products, such as semiconductor devices, in a manufacturing environment including process tools exchanging transport carriers with an automated transport system, wherein the products, such as substrates for semiconductor devices, are processed on the basis of groups or lots defined by the contents of the transport carriers.

2. Description of the Related Art

Today's global market forces manufacturers of mass products to offer high quality devices at a low price. It is thus important to improve yield and process efficiency to minimize production costs. This holds especially true in the field of semiconductor fabrication, since, here, it is essential to combine cutting-edge technology with volume production techniques. It is, therefore, the goal of semiconductor manufacturers to reduce the consumption of raw materials and consumables while at the same time improve process tool utilization. The latter aspect is especially important since, in modern semiconductor facilities, equipment is required which is extremely cost-intensive and represents the dominant part of the total production costs.

Integrated circuits are typically manufactured in automated or semi-automated facilities, by passing substrates comprising the devices through a large number of process and metrology steps to complete the devices. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask for further processes in structuring the device layer under consideration by, for example, etch or implant processes and the like. Thus, layer after layer, a plurality of process steps are performed based on a specific lithographic mask set for the various layers of the specified device. For instance, a sophisticated CPU requires several hundred process steps, each of which has to be carried out within specified process margins so as to fulfill the specifications for the device under consideration. Since many of these processes are very critical, such as many photolithography steps, a plurality of metrology steps have to be performed to efficiently control the process flow and to monitor the performance of the respective process tools. For example, so-called pilot substrates are frequently processed and subjected to measurement procedures prior to actually releasing the associated group of "parent" substrates in order to test the compliance with predefined process margins. Typical metrology processes may include the measurement of layer thickness, the determination of dimensions of critical features, such as the gate length of transistors, the measurement of dopant profiles, and the like. As the majority of the process margins are device-specific, many of the metrology processes and the actual manufacturing processes are specifically designed for the device under consideration and require specific parameter settings at the adequate metrology and process tools.

In a semiconductor facility, a plurality of different product types are usually manufactured at the same time, such as memory chips of different design and storage capacity, CPUs of different design and operating speed and the like, wherein the number of different product types may even reach one hundred and more in production lines for manufacturing ASICs (application specific ICs). Since each of the different product types may require a specific process flow, different mask sets for the lithography, specific settings in the various process tools, such as deposition tools, etch tools, implantation tools, chemical mechanical polishing (CMP) tools and the like may be necessary. Consequently, a plurality of different tool parameter settings and product types may be encountered simultaneously in a manufacturing environment. Thus, a mixture of product types, such as test and development products, pilot products, different versions of products, at different manufacturing stages, may be present in the manufacturing environment at a time, wherein the composition of the mixture may vary over time depending on economic constraints and the like, since the dispatching of non-processed substrates into the manufacturing environment may depend on various factors, such as the ordering of specific products, a variable degree of research and development efforts and the like. Thus, frequently, the various product types may have to be processed with a different priority to meet requirements imposed by specific economic or other constraints.

Despite these complex conditions, it is an important aspect with respect to productivity to coordinate the process flow within the manufacturing environment in such a way that high performance, for example in terms of tool utilization, of the process tools is achieved, since the investment costs and the moderately low "life span" of process tools, particularly in a semiconductor facility, significantly determine the price of the final semiconductor devices. In modern semiconductor facilities, a high degree of automation is typically encountered, wherein the transport of substrates from and to the process and metrology tools is accomplished on the basis of respective transport carriers accommodating a specific maximum number of substrates. The number of substrates contained in a carrier is also referred to as a lot and the number of substrates is therefore frequently called the lot size. In a highly automated process line of a semiconductor facility, the transport of the carriers is mainly performed by an automated transport system that picks up a carrier at a specific location, for example a load port associated with a process or metrology tool, within the environment and delivers the carrier to its destination, for instance a load port of another process or metrology tool that may perform the next process or processes required in the respective process flow of the products under consideration. Thus, the products in one carrier typically represent substrates to be processed in the same process tool, wherein the number of substrates in the carrier may not necessarily correspond to the maximum number of possible substrates. That is, the lot size of the various carriers may vary, wherein typically a "standard" lot size may dominate in the manufacturing environment. For example, one or more pilot substrates, which may be considered as representatives of a certain number of parent substrates contained in a certain number of carriers filled with the standard lot size, may be transported in a separate carrier, since they may undergo a specific measurement process and therefore may have to be conveyed to a corresponding metrology tool, thereby requiring an additional transport job. Based on the results of the measurement process, the waiting parent substrates may then be delivered to the respective process tool.

The supply of carriers to and from process tools is usually accomplished on the basis of respective "interfaces," also referred to as loading stations or load ports, which may receive the carriers from the transport system and hold the carriers to be picked up by the transport system. The transport system comprises a rail system that is typically attached to the clean room ceiling so that the transport system is usually referred to as an overhead transport system (OHT). Furthermore, the OHT accommodates a plurality of vehicles running along the OHT rails in order to convey a transport carrier that is to be exchanged with a specific process tool by means of one or more load ports associated with the tool under consideration. Due to the increasing complexity of process tools, having implemented therein a plurality of functions, the cycle time for a single substrate may increase. Hence, when substrates are not available at the tool although being in a productive state, significant idle times or unproductive times may be created, thereby significantly reducing the utilization of the tool. Thus, typically, the number and configuration of the load ports is selected such that one or more carriers may be exchanged at the load port(s) while the functional module of the process tool receives substrates from another load port to achieve a cascaded or continuous operation of the functional module of the process tool. The time for the exchange of carriers between the automated transport system and the respective process or metrology tool depends on the transport capacity of the transport system and the availability of the carrier to be conveyed at its source location. Ideally, when a corresponding transport request for a specified lot currently processed in a source tool is to be served, the respective substrates should be available at the time the transport system picks up the carrier including the lot and delivers the carrier at the destination tool such that a continuous operation may be maintained. Consequently, the respective carrier should be delivered to the destination tool when or before the last substrate of the carrier currently processed in the destination tool is entered into the process module so that a continuous operation may be achieved on the basis of the newly arrived carrier. Thus, for an ideal continuous operation of a process tool, one carrier would be exchanged while another carrier is currently processed.

Depending on the capacity of the tool interface, for instance the number of load ports provided, a certain buffer of carriers and thus substrates may be provided in order to generate a certain tolerance for delays and irregular deliveries, which may, however, significantly contribute to tool costs. In some circumstances, the required carrier exchange time for maintaining a continuous operation of the tool under consideration may even be negative, thereby requiring a change of the substrate handling scenario. Moreover, the actual carrier exchange time, i.e., the time required for picking up a full carrier including processed substrates from the load port and putting a carrier onto the load port to provide new substrates to be processed, does not substantially depend on the lot size, whereas the time window for the opportunity to perform an actual carrier exchange is highly dependent on the respective lot size, since a small currently processed lot provides only a reduced time interval for exchanging another carrier without producing an undesired idle time, also referred to as a window of opportunity for carrier exchange. Thus, the presence of a mixture of lot sizes, such as pilot lots, development lots and the like, or the presence of lots having a high priority, may negatively affect the overall performance of process tools.

Moreover, in view of cycle time enhancement for the individual products and to address flexibility in coping with customers' specific demands, the lot size may decrease in future process strategies. For example, currently 25 wafers per transport carrier may be a frequently used lot size, wherein, however, many lots may have to be handled with a lesser number of wafers due to the above requirements, thereby imposing a high burden on the process capabilities of the automatic transport system and the scheduling regime in the facility in order to maintain a high overall tool utilization. That is, the variability of the carrier exchange times for exchanging the carriers with respective load stations of the process tools may be high and thus a significant influence of the transport status in the manufacturing environment on the overall productivity may be observed. Thus, when designing or re-designing a manufacturing environment, for instance by installing new or additional equipment, the tool characteristics with respect to transport capabilities, such as the number of load ports for specific tools and the like, and the capabilities and operational behavior of the automatic material handling system (AMHS), may represent important factors for the performance of the manufacturing environment as a whole. The handling of small and different lot sizes within the manufacturing environment that is designed for a moderately large standard lot size may therefore require highly sophisticated scheduling regimes to compensate for the lack of sufficient carrier exchange capacity in the existing tools. However, the presence of small lot sizes may nevertheless result in a significant reduction of tool utilization, in particular for high throughput tools, as previously explained, due to the fact that a small or negative carrier exchange time associated with the processing of small lot sizes may not be compensated for, unless the number of load ports is significantly increased, as will be described with reference to FIGS. 1$a(a)$-1$c(a)$ and 1$a(b)$-1$c(b)$ in more detail.

FIG. 1$a(a)$ schematically illustrates a top view of a portion of a manufacturing environment 150 and FIG. 1$a(b)$ illustrates a corresponding timing diagram for operating the manufacturing environment 150. The manufacturing environment 150 may comprise a process tool 160, which is assumed to represent a process of high throughput with a rate of 500 substrates per hour. For instance, the process tool 160 may represent any appropriate cluster tool having a plurality of process chambers for performing a specified manufacturing process, such as an etch process, a deposition process and the like. The process tool 160 comprises a load port assembly 161 comprising a plurality of load ports LP1, LP2, LP3, LP4 which are configured to exchange substrate carriers 173 with an automated transport system 170. The transport system 170 is provided as an overhead transport system (OHT) comprising one or more rails 171, which are attached to the ceiling of a clean room (not shown) as is typically provided in the manufacturing environment 150 for fabricating semiconductor devices. Furthermore, appropriate transport vehicles 172 are provided which are configured to load and unload a substrate carrier, such as the carrier 173, at a respective one of the load ports LP1, LP2, LP3, LP4. It should be appreciated that the vehicles 172 typically comprise any appropriate mechanical components, such as grippers and the like, which enable the vehicles 172 to pick up the substrate carrier 173 from a load port by hoisting a carrier up to the vehicle 172 and also by hoisting down the carrier 173 at a destination load port. Moreover, typically, the transport system 170 is designed as a ring-like transport system, wherein a specified transport direction is determined for each process tool in the manufacturing environment 150. For instance, in the example of FIGS. 1$a(a)$ and 1$a(b)$, the transport direction may be from the right to the left.

During operation of the manufacturing environment 150, the high throughput of the process tool 160 causes a large flow of substrate carriers 173 to the load port assembly 161 to provide the required substrates to be processed in the tool 160, while the same flow of substrate carriers 173 also has to be maintained to remove the substrates that have already been processed in the tool 160. For example, if a substantially continuous operating mode is to be established with the maximum throughput of the tool 160, which is desirable in view of efficiency, about 42 carriers 173 per hour have to be picked up by the load port assembly 161. For a typical carrier exchange time, i.e., the time required for the transport system 170 to pick up a single transport carrier from a specific load port and to deliver a new transport carrier to the same load port, in the range of 6-10 minutes, one load port of the assembly 161 may support the delivery of 6-10 carriers 173 per hour and the pickup of 6-10 carriers per hour.

FIG. 1*a*(*b*) schematically illustrates a timing diagram corresponding to a process scenario as described above. That is, at each of the load ports LP1, LP2, LP3, LP4, a sequence of time intervals t1 and t2 would be required for a substantially continuous operational mode. In the example shown, the time interval t1 may correspond to a time interval during which substrates are loaded into a process module of the tool 160 and are subsequently being received by the substrate carrier, wherein respective small time intervals of approximately 0.1 minute may also be included in t1, which corresponds to carrier handling activities, such as a time interval td for docking the carrier 173 to the respective load port and opening a carrier door, if, for instance, it is provided in the form of a front opening unified pod (FOUP). Similarly, a time interval tu for closing the door and undocking the carrier may be included in the time interval t1. The time interval t2 may then represent the time available for the transport system 170 to pick up a respective carrier and position a new substrate carrier including substrates to be processed in the tool 160. The corresponding time interval t2 may also be referred to as carrier exchange time. As is evident from FIG. 1*a*(*b*), a slight overlap of the time intervals t1 at each of the respective load ports LP1, LP2, LP3, LP4 is required to ensure a continuous operation. Thus, prior to the expiration of the time interval t1 on load port LP4, a new carrier has to be supplied to the load port LP1 so that the corresponding carrier exchange time t2 is substantially determined by the overall process time for a respective carrier, which therefore depends on the number of substrates contained therein, for a given throughput of the process tool 160. In the process scenario described above, it may be assumed that a "small lot size" process mode has to be established in the manufacturing environment 150 by using, for instance, 12 substrates per carrier. In this case, the overall process time for one carrier may be 1.7 minutes, thereby resulting in a carrier exchange time of 3.6 minutes. Since a respectively short carrier exchange time may not be supported by the transport system 170, conventionally the number of load ports is increased.

FIG. 1*b*(*a*) schematically illustrates the manufacturing environment 150, wherein the process tool 160 may have the load port assembly 161 with 5 load ports LP1, LP2, LP3, LP4, LP5. Consequently, the width of the process tool 160, at least a front end portion thereof, may have to be increased to accommodate the increased number of load ports. Thus, an increased amount of clean room space may have to be provided.

FIG. 1*b*(*b*) schematically illustrates the situation during a continuous operation under the above-specified conditions. As is evident from the timing diagram of FIG. 1*b*(*b*), the time interval t2, i.e., the carrier exchange time, may increase to 5.0 minutes, which, however, may still not be within the capabilities of the transport system 170.

FIG. 1*c*(*a*) schematically illustrates a situation in which the process tool 160 comprises six load ports LP1, LP2, LP3, LP4, LP5, LP6, thereby even further increasing the width of the tool 160 and thus, the required floor space in the clean room. As shown in FIG. 1*c*(*b*), the carrier exchange time t2 may increase to 6.5 minutes, which may be within the capabilities of the transport system 170, thereby enabling a substantially continuous operation of the tool 160.

As a consequence, according to conventional strategies, support of processing of small lot sizes may require a significant increase of the number of load ports, which may, however, require substantial modifications of existing manufacturing environments or which may not even be compatible with existing layouts of clean rooms due to the non-available additional floor space. If an enhanced flexibility with respect to process regimes may be required in newly designed manufacturing environments, a sufficient high number of load ports may have to be taken into consideration when designing the manufacturing environment, which may add significant additional costs, since the clean room area has to initially be adapted to the desired degree of flexibility, i.e., to the minimum lot size, for which a substantially continuous operation of high throughput tools is desired.

The present disclosure is directed to various systems and techniques that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques for enhancing the I/O (input/output) capabilities of a load port assembly of process tools in a space saving manner by introducing a plurality of transfer places between the transport system and the equipment. The transfer places are separated from the load port and may be configured to enable a carrier exchange with a transport system and the load ports of the equipment under consideration. Since the transfer places of the respective transfer buffer system may be positioned at any appropriate location, for instance partially above the front end of the process tool under consideration, a significant increase of the I/O capabilities may be achieved while the requirement for additional floor space may be significantly less, compared to a respective performance gain obtained by adding one or more additional load ports, as is the case in conventional strategies, as previously explained. In some illustrative aspects, the transfer places may be provided in the form of an array expanding in at least two dimensions, thereby also utilizing special areas of the clean room that would not be available for enhancing the I/O capabilities by adding additional load ports.

One illustrative method disclosed herein relates to the exchanging of transport carriers between an automated transport system and a process tool of a manufacturing environment. The method comprises supplying a first substrate carrier to a first transfer place of a two-dimensional array of transfer places, wherein each of the transfer places is accessible by a vehicle of the automated transport system. The method further comprises transferring the first substrate carrier to a first one of a plurality of load ports of the process tool and transferring a second substrate carrier from a second one of the plurality of load ports to the first transfer place of the two-dimensional array. Additionally, the method comprises picking up the second transport carrier from the first transfer place by a vehicle of the automated transport system.

One illustrative manufacturing environment disclosed herein comprises a process tool associated with a load port assembly comprising a plurality of load ports. Furthermore, the manufacturing environment comprises an automated transport system comprising a rail system extending along the plurality of load ports and comprising a plurality of vehicles movable on the rail system for exchanging substrate carriers with the load ports. Moreover, the manufacturing environment further comprises a transfer buffer system comprising a plurality of transfer buffer places configured to exchange substrate carriers with the vehicles and to exchange substrate carriers with the plurality of load ports.

Another illustrative manufacturing environment disclosed herein comprises a process tool including a plurality of load ports and a transport system configured to transport substrate carriers within the manufacturing environment. Furthermore, a transfer buffer system is provided that comprises a plurality of buffer places, each of which is configured to exchange a substrate carrier with the transport system and with each of the plurality of load ports.

BRIEF DESCRIPTION OF THE DRAWINGS

The disclosure may be understood by reference to the following description taken in conjunction with the accompanying drawings, in which like reference numerals identify like elements, and in which:

FIGS. 2e-2f schematically illustrate a top view and a side view, respectively, of a manufacturing environment including a specific layout for the buffer system to allow sufficient communication with an automated transport system according to further illustrative embodiments; and FIGS. 2g-2h schematically illustrate a top view and a side view, respectively, depicting a further exemplary layout for the buffer system, wherein carriers may be exchanged on the basis of two parallel rails which may correspond to opposite transport directions or to parallel transport directions according to still further illustrative embodiments.

Figure 1A:
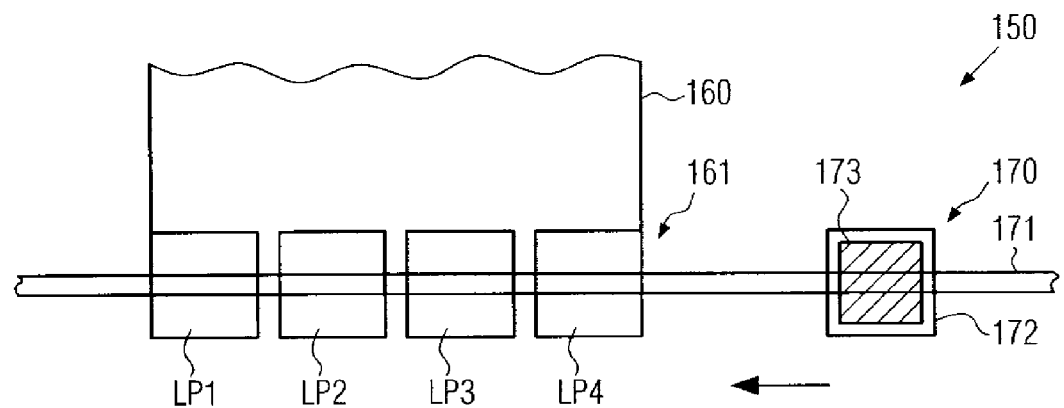
FIGS. 1a(a)-1c(b) schematically illustrate a manufacturing environment with a high throughput tool with an increasing number of load ports for increasing the carrier exchange time and timing diagrams (FIGS. 1a(b)-1c(b)) which represent the operational behavior with respect to carrier exchange time for a specified process scenario according to conventional strategies.
Figure 1B:
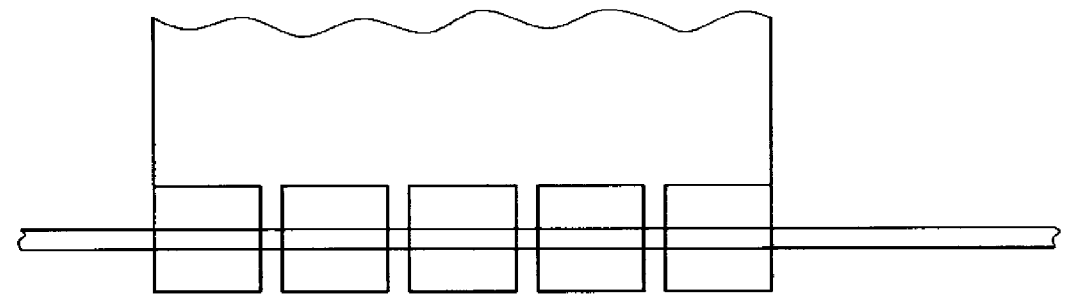
Figure 1C:
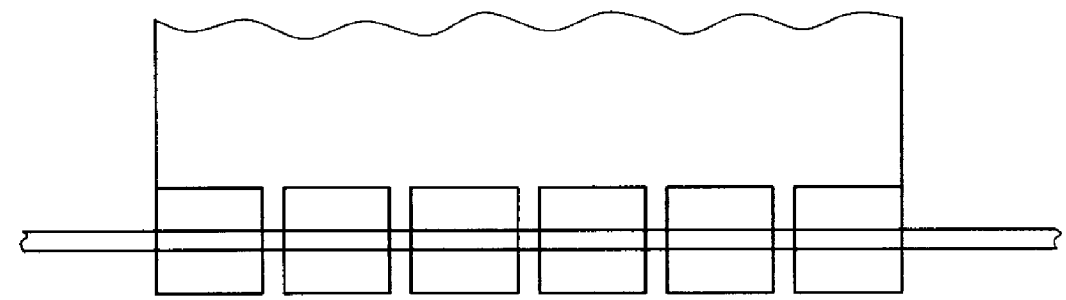
Figure 1A:
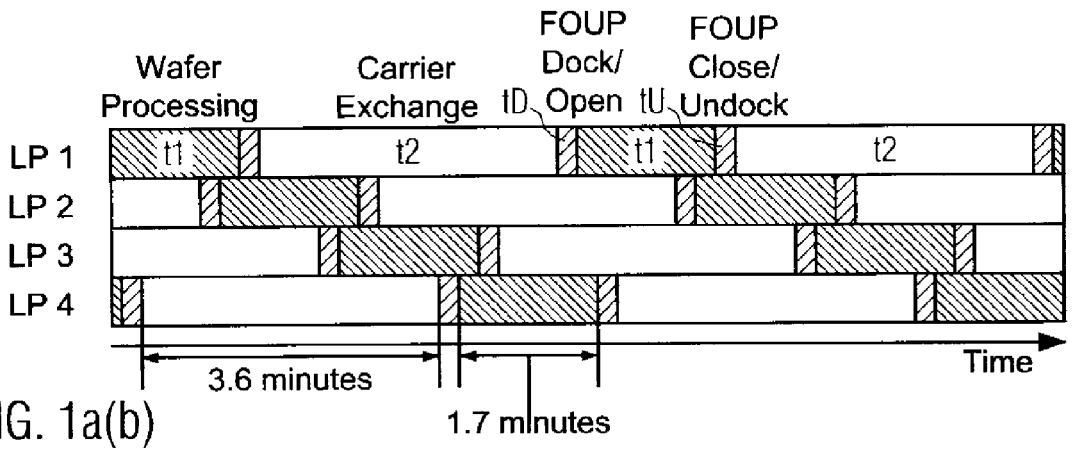
Figure 1B:
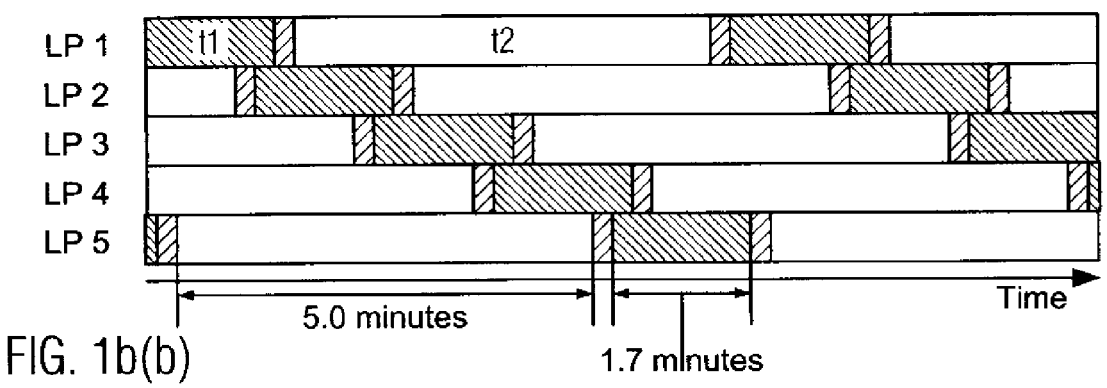
Figure 1C:
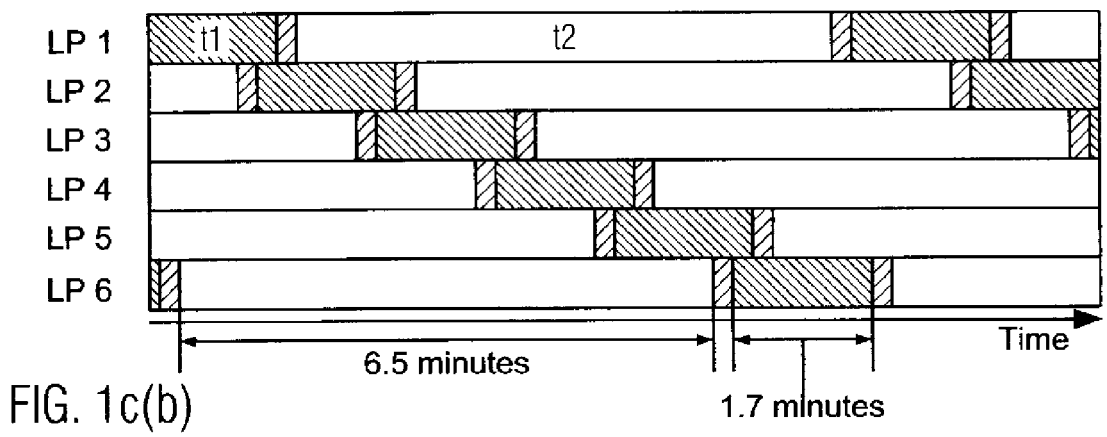

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to systems and methods for increasing the I/O capabilities of process tools for a given load port assembly. For this purpose, a transfer buffer system may be provided, which may be installed in a highly efficient manner, for instance, without consuming additional floor space, wherein each of the transfer places may be accessible by an automated transport system so that the number of carriers provided in the vicinity of the respective process tool may be increased without being restricted by the carrier exchange capability of the automated transport system. That is, the transport system may "see" an increased number of stations for loading and unloading substrate carriers, thereby "virtually" providing an increased number of "load ports," however, only at the site of the transport system, whereas the transfer buffer places may individually interact with the load ports on the basis of tool-specific requirements, without being restricted by the transport system. Since the transfer buffer places may not act as sources for supplying individual substrates to a process module, the buffer places may be positioned at any appropriate location in the vicinity of the process tool under consideration so that, for a given basic configuration of the process tool, the I/O capabilities thereof may be enhanced with respect to the processing of small lot sizes with a significantly reduced amount of additional floor space required or in some illustrative embodiments even without consuming additional floor space, thereby providing the potential for retrofitting existing manufacturing environments. Consequently, process scenarios with small lot sizes, a mixed operational mode and the like may be realized in a highly flexible manner for existing and future manufacturing environments at significantly reduced cost, or a throughput loss caused by process scenarios requiring small lot sizes may be reduced.

Figure 2A:
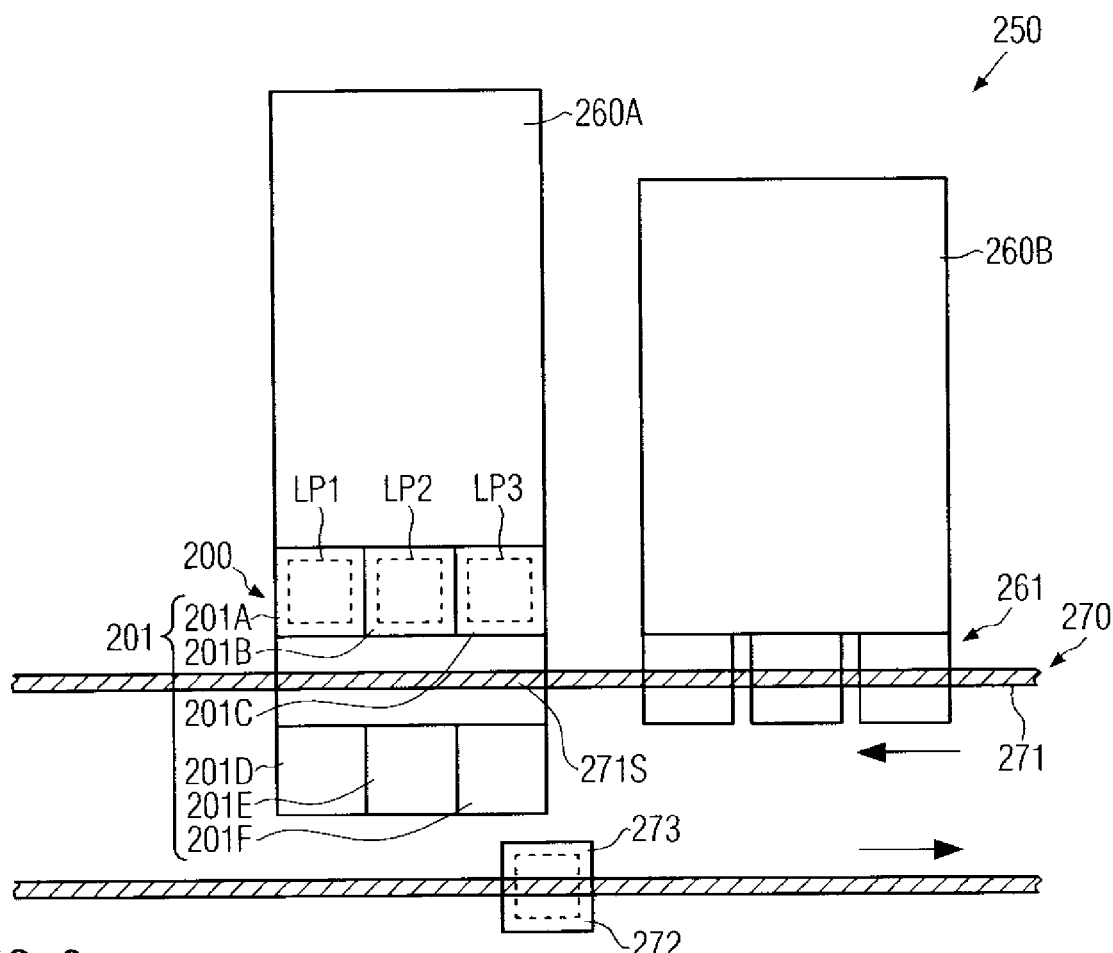
FIGS. 2a-2b schematically illustrate a top view and a side view, respectively, of a manufacturing environment comprising a process tool, a transport system and a transfer buffer system according to illustrative embodiments.

FIG. 2a schematically illustrates a manufacturing environment 250, which may represent, in one illustrative embodiment, a facility for manufacturing or processing microstructure devices, such as integrated circuits, micromechanical devices, opto-electronic devices and the like. As previously explained, in these cases, a clean room environment may be required to control environmental parameters, such as the size of airborne particles, the number thereof per unit volume, temperature, humidity and the like. For this reason, the investment costs per unit area of a clean room environment are relatively high, in particular if highly advanced semiconductor devices are to be processed, so that a reduction of the required floor space of the manufacturing environment 250 may directly affect the final price of the product.

The manufacturing environment 250 may typically comprise a plurality of process tools 260A, 260B, wherein, for convenience, only two process tools are illustrated. The process tools 260A, 260B may represent sophisticated equipment, such as photolithography tools, etch tools, deposition tools, implantation tools, anneal tools and the like. It should be appreciated that the process tools 260A and/or 260B may represent a cluster of a plurality of process modules (not shown), which may perform the same or different processes, wherein the tool internal substrate transport may be performed on the basis of appropriate substrate handling mechanisms (not shown), and wherein the overall throughput of the respective process tools 260A, 260B may be determined by the type of process or processes and the number of process modules. For instance, the process tool 260A may represent a process tool of high throughput, which may, for instance, be obtained by providing a high number of process modules performing the same process, such as deposition chambers, etch chambers and the like. Consequently, the process tool 260A may represent a tool that may be highly sensitive to a change of lot size in the manufacturing environment 250, since, as previously explained with reference to FIGS. 1a(a)-1c(b), a reduction of the lot size may significantly increase the number of substrate carriers to be delivered to the tool 260A, thereby reducing the corresponding carrier exchange time. Thus, a transport system 270, which may comprise a corresponding rail system 271 for accommodating appropriately designed vehicles 272, may not be able to provide the respective carrier exchange capabilities for supporting a reduced carrier exchange time as previously explained. Consequently, one or more of the process tools 260A, 260B may comprise a transfer buffer system 200, which is operatively connected between the transport system 270 and a load port assembly 261 to increase the number of "interaction" stations for the transport system 270.

In the embodiment shown, the process tools 260A, 260B may comprise three load ports, LP1, LP2 and LP3 within the associated load port assembly 261, wherein the load port assembly 261 may be appropriate for covering the desired process scenarios with respect to the tool 260B, whereas a significant reduction in throughput would have been encountered with the tool 260A when operated on the basis of only three load ports, as is, for instance, explained with reference to FIGS. 1a(b), 1b(b) and 1c(b). Consequently, the transfer buffer system 200 may be provided with a plurality of transfer places 201A, 201B, 201C, 201D, 201E, 201F, also commonly referred to as transfer buffer places 201, each of which is appropriately positioned so as to be accessible by a vehicle 272 of the transport system 270. In the embodiment shown, the transfer places 201 are positioned in an array-like manner, i.e., the plurality of transfer places 201 may be arranged at least as two rows with respect to a transport direction defined by the rail system 271, i.e., by rail section 271S that extends along the load port assembly 261, i.e., the load ports LP1, LP2, LP3. Consequently, the "two-dimensional" array defined by the transfer places 201 provides the possibility of positioning the additional interaction stations for the transport system 270 in a highly space-efficient manner with respect to a width of the process tool 260A, i.e., with respect to an extension along the transport direction as defined by the rail section 271S.

For example, by positioning the plurality of transfer places 201 in an array-like manner at opposite sides of the rail section 271S, six carrier exchange points may be provided for the transport system 270 without increasing the width of the process tool 260A. Each of the plurality of transfer places 201 may in turn be configured to act as an "individual transport system" to enable the exchange of carriers with each of the load ports LP1, LP2 and LP3. For this purpose, any appropriate mechanism may be used, such as carrier lifts, cranes and the like, to vertically and laterally move respective substrate carriers according to operational requirements. Respective mechanic means for vertically and/or horizontally moving substrate carriers are well known in the art of semiconductor manufacturing and are therefore not described herein. These components may be readily implemented according to the specific situation in the environment into the respective transfer places 201 on the basis of the technical teaching disclosed herein. For example, the transfer places 201A, 201B, 201C may be equipped with appropriate carrier lifts, cranes and the like so as to endow the transfer places 201 with the capability of vertically hoisting down or hoisting up substrate carriers from the respective load port. Similarly, a horizontal motion may be achieved by robot mechanisms to create a linear motion interconnecting a row defined by the transfer places 201A, 201B, 201C. Similarly, horizontal and vertical position changes may be achieved on the basis of appropriate mechanisms to allow the positioning of a substrate carrier located within any one of the transfer places 201D, 201E and 201F at any of the load ports LP1, LP2, LP3.

Figure 2B:
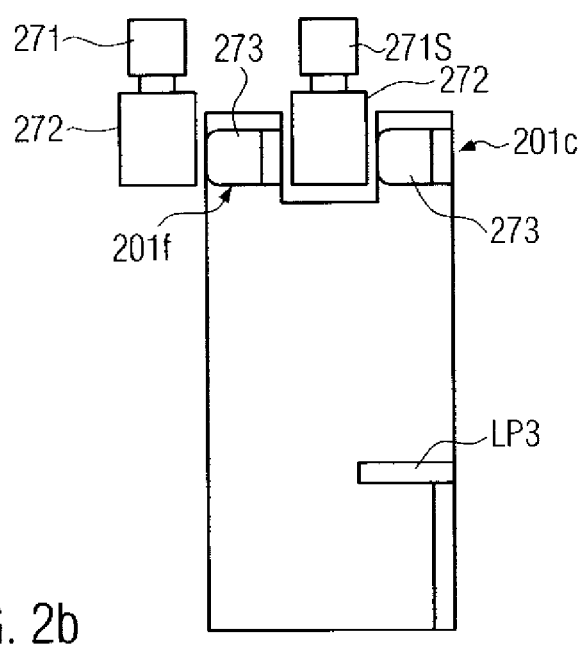

FIG. 2b schematically illustrates a side view of a portion of the manufacturing environment 250, wherein respective substrate carriers, such as FOUPs, are positioned in the transfer places 201C and 201F. In one illustrative embodiment, the vehicle 272 supplying respective substrate carriers to the transfer places 201 may be configured so as to enable the receipt or supply of carriers 273 in a sideward direction, thereby providing an efficient interaction scenario for the transfer buffer system 200 with the transport system 270. That is, the respective vehicles 272 may be positioned next to an appropriate pair of transfer places and the carrier contained in the vehicle 272 may be positioned in the desired transfer place, substantially without requiring mechanical interaction by the respective transfer place. It should be appreciated, however, that any other mechanical mechanism may be used to transfer a substrate carrier from one of the vehicles 272 into one of the desired transfer places 201.

Figure 2C:
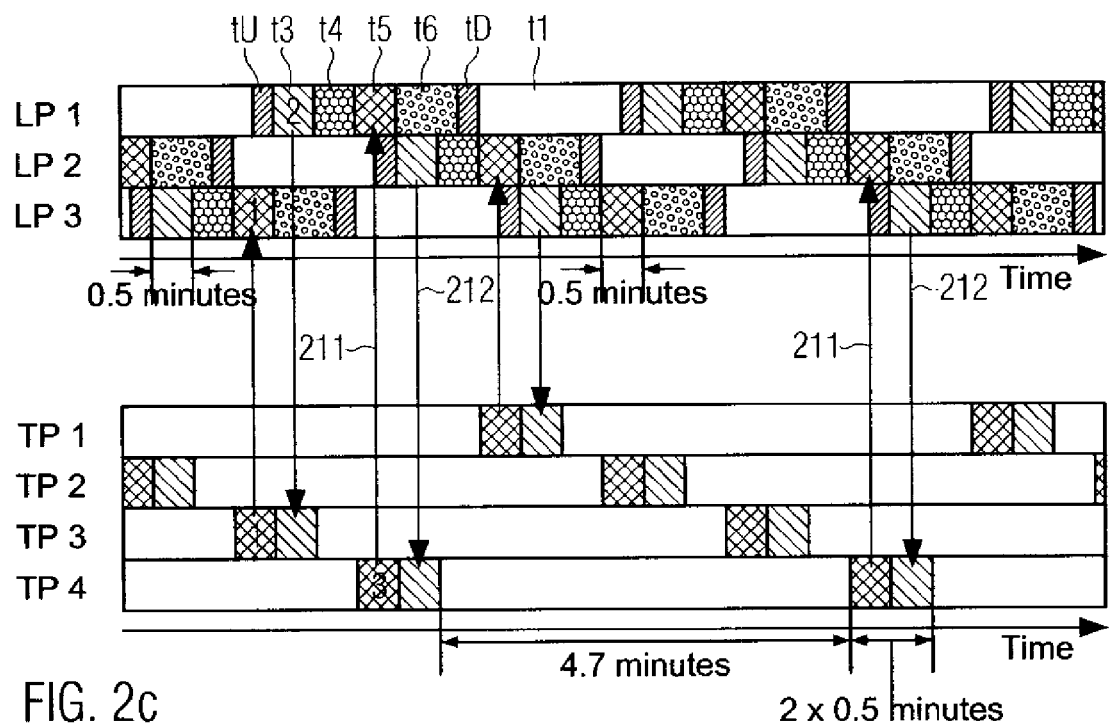
FIG. 2c schematically illustrates a timing diagram for illustrating the effect of a transfer system with respect to increasing a corresponding carrier exchange time.
Figure 2D:
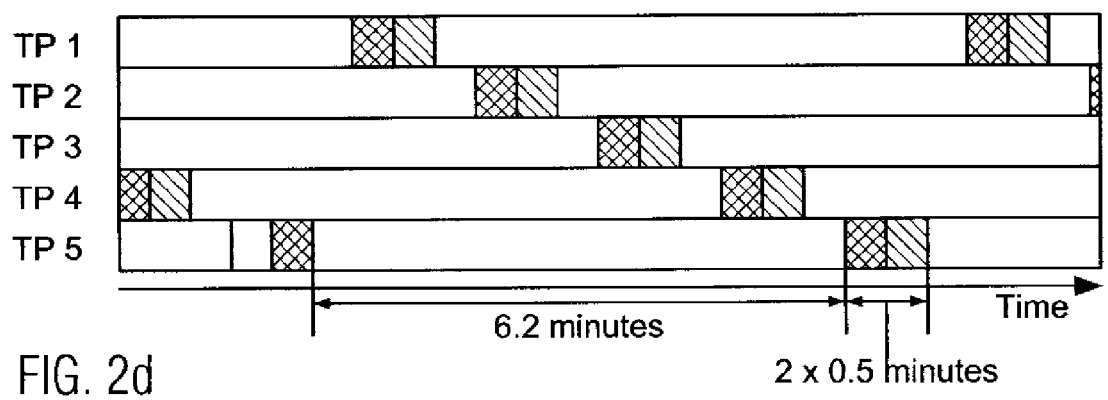
FIG. 2d schematically illustrates a timing diagram associated with the diagram of FIG. 2c, wherein the number of buffer places is increased so as to obtain a desired carrier exchange time according to illustrative embodiments.

With reference to FIGS. 2c-2d, the operational behavior of the manufacturing environment 250 will now be described in more detail, wherein a process scenario may be considered, as is also described with reference to FIGS. 1a(a)-1c(b). At this time, it may be assumed that the process tool 260A may have a throughput of 500 substrates per hour, when continuously operated, while a typical carrier exchange time of the transport system 270 may be in the range of 6-10 minutes. It may be assumed that the tool 260A is in a continuous operational mode, wherein 12 substrates per carrier represent the standard lot size during this process phase.

FIG. 2c schematically illustrates a timing diagram representing the situation at the load ports LP1, LP2 and LP3 of the tool 260A. In the timing diagram, a time interval t1 represents the time period during which substrates of a respective substrate carrier are processed with the tool 260A, which may be 1.7 minutes, as previously explained. Thereafter, a time interval tU corresponds to carrier activities, such as closing the carrier door, undocking the carrier. Thereafter, in one illustrative embodiment, the carrier positioned on load port 1 may be unloaded from the load port by interacting with one of the transfer places 201. In the process scenario according to FIG. 2c, it may be assumed that the transfer buffer system 200 may comprise four transfer places, which for convenience are referred to as TP1, TP2, TP3, TP4. For example, transfer place TP3 may receive the carrier unloaded from load port 1 containing substrates that have been processed by the tool 260A. In the meantime, the continuous operation of the tool 260A is maintained by processing substrates corresponding to a respective substrate carrier positioned on load port LP2. Prior to the expiration of the corresponding time interval t1 of the load port LP2, a carrier previously supplied to transfer place TP by the transport system 270 may be positioned on the load port LP1 after a certain idle time interval t4, which is to be understood as a time period, in which a corresponding load port is empty. The carrier transaction for transferring the carrier from transfer place TP4 to load port LP1, as indicated by arrow 211, may be considered as a carrier transaction between the transfer buffer system 200 and the load port assembly 261 and may be assigned a certain fixed time interval, which may represent the maximum time interval in the transfer buffer system 200 that may occur. Consequently, after the carrier transaction 211, load port LP1 is ready for delivering the substrates, wherein a corresponding idle time interval t6 may occur, depending on the process specifics, followed by a time interval tD, which accommodates the docking activity, the opening of the carrier door and the like. Thereafter, a further time interval t1 follows.

In one illustrative embodiment, the carrier transaction 211 may be immediately followed by a further carrier transaction 212 for transferring the carrier of load port LP2 to the transfer place TP4 so that the corresponding carrier transactions 211, 212 represent an associated pair of carrier transactions, after which the transfer place TP4 may be in an idle state. That is, the end of the carrier transaction 212 may define the beginning of a respective carrier exchange time for the transfer place TP4 in respect to the transport system 270. It is to be appreciated that selecting the operating mode such that the carrier transactions 211, 212 are immediately subsequent to each other may provide maximum carrier exchange time. The respective carrier transactions 211, 212 may also occur at the remaining transfer places TP1, TP2 and TP3, thereby maintaining a continuous supply of carriers to the three load ports LP1, LP2 and LP3, which ensures a continuous operation of the process tool 260A. As evident from FIG. 2d, the resulting carrier exchange time of the transfer places TP1, TP2, TP3, TP4 may be 4.7 minutes, which may, however, be beyond the capabilities of the transport system 270.

FIG. 2d schematically illustrates a process scenario, in which the buffer system 200 comprises five transfer places TP1, TP2, TP3, TP4, TP5. Consequently, the time between two pairs of subsequent carrier transactions 211, 212 at each transfer place may be increased to 6.2 minutes, which may be appropriate for the transport system 270. By adding a further transfer place, the corresponding carrier exchange time may be even further increased, for instance, by using six transfer places 201 of the system 200 as shown in FIGS. 2a and 2b.

Consequently, by providing a plurality of transfer places, wherein the number of transfer places may be higher than the number of load ports, the effective carrier exchange time may be increased with a reduced amount of floor space consumption or even without the consumption of additional floor space, compared to conventional techniques, due to the space-efficient arrangement of the transfer places 201 in an array-like manner.

FIG. 2e schematically illustrates a top view of the manufacturing environment 250 according to further illustrative embodiments. As shown, the process tool 260A, which may represent a high throughput tool, may be provided in combination with the tool 260B and a further process tool 260C, each of which comprises an associated load port assembly 261. For example, each of the tools 260A, 260B, 260C may comprise three load ports, wherein the three load ports of the tool 260A may be positioned vertically below the transfer places 201 of the buffer system 200. In this embodiment, the array-like configuration of the buffer system 200 may be such that a plurality of transfer places, in the present example five transfer places, may be accessed on the basis of the rail section 271S, which also connects to the load port assemblies 261 of the tools 260B and 260C. Moreover, the inner transfer places 201A may interact with the transport system 270 by a second rail section 271T, which may branch off from the rail system 271 in an appropriate manner so as to comply with respective constraints for conventional overhead transport components. For example, a specified lateral distance between the tools 260B and 260A on the one hand and the tools 260C and 260A on the other hand may have to be taken into consideration. As shown, a portion of the curvature required in the second rail section 271T may restrict the number of inner transfer places 201A. Thus, compared to the configuration shown in FIG. 2b, a certain increase of the width of the system 200 may be obtained for the benefit of providing an increased number of transfer places.

FIG. 2f schematically illustrates a cross-sectional view of the manufacturing environment 250 of FIG. 2e. As shown, the buffer places 201A corresponding to the rail section 271T may be positioned vertically above the load port assembly 261.

FIG. 2g schematically illustrates a top view of the manufacturing environment 250 according to a further illustrative embodiment, in which the transfer places 201 of the buffer system 200 are positioned such that the inner portion 201A may be accessed by means of the rail system 271 according to a first transport direction 271A, which, in the embodiment shown, may represent the transport direction of the rail also used for exchanging substrate carriers with the process tool 260B, 260C. A second portion of the transfer places, indicated as 201B, may be associated with the rail system 271 according to a second transport direction 271B, which may be the inverse transport direction, or which may be the same transport direction as the transport direction 271A, depending on the overall design of the transport system 270. By using the overhead rail 271 of the transport system 270 as shown, a highly space-efficient placement of the buffer system 200 may be achieved substantially without significant modifications of an existing transport system. That is, with respect to the process tools 260B and 260C, the front end portion of the tool 260A may be positioned in a collinear manner, while the area occupied by the transport system 270 may efficiently be used as a transfer buffer area, substantially without requiring any modifications with respect to the size and position of the process tool 260A, when initially being equipped with four load ports. It should be appreciated that the process tool 260A may be provided with a lesser number of load ports, for instance, with three load ports wherein a desired number of transfer places may be provided in the system 200. For example, if an increase of tool width may not be desirable and three load ports may be provided, the buffer system 200 may comprise five load ports, so as to obtain a substantially continuous operation for a process scenario as previously described with reference to FIGS. 2c-2d. In other cases, six transfer places may be provided to obtain a symmetric configuration with respect to the portions 201A, 201B. In other cases, the tool width may be increased to accommodate eight transfer buffer places, wherein three or four load ports may be provided. It should be appreciated in this arrangement, similarly as the arrangement described with reference to FIG. 2a, no transport system related limitations with respect to a lateral distance of the tools 260A, 260B, 260C are imposed due to the linear extension of the rail system 271.

As discussed above, in other illustrative embodiments, the rail system 271 may provide the same transport direction on both rails, if a plurality of rails are provided in the transport system 270 that may be operated in the same direction.

FIG. 2h schematically illustrates a cross-sectional view of the relevant portion of the transport system 270, the load port assembly 261 and the transfer buffer system 200.

In the above-described embodiments, a highly efficient increase of the carrier exchange time may be obtained on the basis of a given process tool configuration by providing a transfer buffer system in a spatially highly efficient manner. In the embodiments described so far, an array-like arrangement, i.e., a two-dimensional arrangement, may be used, wherein at least two parallel rows of transfer places have been provided which may have the same length or a different length with respect to a transport direction. It should be appreciated that more than two parallel rows may be provided to further enhance the I/O capabilities of the process tool under consideration. For this purpose, appropriate rail sections may be provided to allow the transport system 270 to directly access each of the transfer buffer places 201. Similarly, a corresponding transport mechanism has to be implemented into each of the transfer buffer places 201 so as to allow a carrier transfer from each of the transfer buffer places to any of the load ports of the tool under consideration.

As a result, by providing transfer places for a given load port assembly in a highly space-efficient manner, for instance, by providing an array-like arrangement, the number of interaction stations seen by the transport system may be significantly increased, thereby also increasing the effective carrier exchange time of the transport system. On the other hand, the transfer places provide a separate interaction with the load port assembly independently from transport activities of the transport system, thereby providing increased flexibility with respect to the handling of different lot sizes while not unduly increasing the tool width compared to conventional strategies, or substantially not increasing the initial width of the respective process tool.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of exchanging transport carriers between an automated transport system and a process tool of a manufacturing environment, the method comprising:

supplying a first substrate carrier to a first transfer place of a two-dimensional array of transfer places, each of said transfer places being accessible by a vehicle of said automated transport system, wherein said automated transport system comprises first and second rails configured to convey the vehicle to different subsets of the transfer places of said two-dimensional array;

transferring said first substrate carrier to a first one of a plurality of load ports of said process tool, wherein the number of said plurality of buffer places is higher than the number of said plurality of load ports;

transferring a second substrate carrier from a second one of said plurality of load ports to said first transfer place of said two-dimensional array; and picking up said second transport carrier from said first transfer place by a vehicle of said automated transport system.

2. The method of claim 1, wherein said second substrate carrier is transferred to said first transfer place after returning all substrates dedicated for said second substrate carrier substantially without an idle time.

3. The method of claim 2, wherein transferring said first substrate carrier to the first load port and transferring said second substrate carrier to said first transfer place are performed as a pair of associated transport activities substantially without an idle time of a transport mechanism connecting said first transfer place with said first and second load ports.

4. The method of claim 3, wherein each of said transfer places performs said pair of associated transport activities in a predetermined cyclic order to first supply a substrate carrier to one load port and receive a different substrate carrier from another load port.

5. The method of claim 1, wherein the number of substrates in each of said first and second substrate carriers is less than 20.

6. The method of claim 1, wherein the different subsets comprise first and second subsets that include mutually exclusive subsets of the transfer places.

7. The method of claim 1, wherein the different subsets comprise first and second subsets that include partially overlapping subsets of the transfer places.

8. The method of claim 1, wherein the first and second rails are substantially parallel to each other.

9. A manufacturing environment, comprising:

a process tool associated with a load port assembly comprising a plurality of load ports;

an automated transport system comprising a rail system extending along said plurality of load ports and a plurality of vehicles movable on said rail system for exchanging substrate carriers with said load ports; and a transfer buffer system comprising a plurality of transfer buffer places configured to exchange substrate carriers with said vehicles and to exchange substrate carriers with said plurality of load ports, wherein the number of said plurality of buffer places is higher than the number of said plurality of load ports, wherein said rail system comprises first and second rails configured to convey the vehicles to different subsets of the plurality of transfer buffer places, respectively.

10. The manufacturing environment of claim 9, wherein at least some of the plurality of transfer buffer places are arranged in the form of a two-dimensional array comprising pairs of first and second transfer buffer places, and wherein the first rail is configured to convey the vehicles to a first subset comprising the first transfer buffer places and the second rail is configured to convey the vehicles to a second subset comprising the second transfer buffer places, and wherein the second subset does not include the first transfer buffer places.

11. The manufacturing environment of claim 10, wherein said array comprises at least two rows of transfer buffer places so that two transfer buffer places are available for each load port.

12. The manufacturing environment of claim 9, wherein the number of said plurality of buffer places is twice the number of said plurality of load ports.

13. The manufacturing environment of claim 9, wherein the first rail comprises a first rail section passing said load port assembly and having transfer buffer places provided on opposite sides thereof so that substrate carriers can discharge wafers to transfer buffer places on a first side of the first rail section and substrate carriers can retrieve wafers from transfer buffer places on a second side of the first rail section, and wherein the second rail comprises a second rail section having transfer buffer places provided on one side thereof.

14. The manufacturing environment of claim 9, wherein the first and second rails comprise first and second rail sections connected to a common single rail section so that the first rail section can deliver substrate carriers to a first subset of transfer buffer places for discharge of wafers and the second rail section can deliver substrate carriers to a second subset of transfer buffer places for retrieval of wafers.

15. The manufacturing environment of claim 9, wherein the first and second rails convey the vehicles in different transport directions.

16. The manufacturing environment of claim 9, wherein at least some of the plurality of transfer buffer places are at least partially positioned vertically above a front end portion of said process tool.

17. The manufacturing environment of claim 9, wherein the different subsets comprise first and second subsets that include mutually exclusive subsets of the transfer places.

18. The manufacturing environment of claim 9, wherein the different subsets comprise first and second subsets that include partially overlapping subsets of the transfer places.

19. The manufacturing environment of claim 9, wherein the first and second rails are substantially parallel to each other.

20. A manufacturing environment, comprising:
a process tool comprising a plurality of load ports;
a transport system configured to transport substrate carriers within said manufacturing environment; and
a transfer buffer system comprising a plurality of buffer places, each of said plurality of buffer places being configured to exchange a substrate carrier with said transport system and with each of said plurality of load ports, wherein the number of said load ports is less than the number of said transfer buffer places, wherein said transport system comprises a rail system having a first rail section and a second rail section, and wherein said first rail section is positioned to exchange substrate carriers with a first subset of said transfer buffer places for discharge wafers to said transfer buffer places from the substrate carriers and said second rail section is positioned to exchange substrate carriers with a second subset of said transfer buffer places for retrieval of wafers from said transfer buffer places to the substrate carriers, wherein the first subset is different than the second subset.

21. The manufacturing environment of claim 20, wherein the number of said load ports is one half of the number of said transfer buffer places.

22. The manufacturing environment of claim 20, wherein said plurality of transfer buffer places are arranged in the form of a two-dimensional array.

23. The manufacturing environment of claim 20, wherein some of said first subset of transfer buffer places are positioned vertically above a respective one of said load ports.

24. The manufacturing environment of claim 20, wherein said first rail section is provided for supporting a first transport direction and said second rail section is provided to support a second transport direction other than said first transport direction.

25. The manufacturing environment of claim 20, wherein said transport system comprises a single rail section positioned to enable a substrate carrier exchange with each transfer buffer place of said transfer buffer system so that substrate carriers can discharge wafers to transfer buffer places on a first side of the single rail section and substrate carriers can retrieve wafers from transfer buffer places on a second side of the single rail section.

26. The manufacturing environment of claim 20, wherein the first and second subsets that comprise mutually exclusive subsets of the transfer places.

27. The manufacturing environment of claim 20, wherein the first and second subsets that comprise partially overlapping subsets of the transfer places.

28. The manufacturing environment of claim 20, wherein the first and second rail sections are substantially parallel to each other.

* * * * *